United States Patent [19]

Ward

[11] Patent Number: 4,657,108

[45] Date of Patent: Apr. 14, 1987

[54] CONSTANT PRESSURE DEVICE

[76] Inventor: Brian D. Ward, 36 Glenferrie Road, Malvern, Victoria, Australia

[21] Appl. No.: 672,241

[22] PCT Filed: Mar. 2, 1984

[86] PCT No.: PCT/AU84/00033

§ 371 Date: Nov. 2, 1984

§ 102(e) Date: Nov. 2, 1984

[87] PCT Pub. No.: WO84/03600

PCT Pub. Date: Sep. 13, 1984

[30] Foreign Application Priority Data

Mar. 2, 1983 [AU] Australia ............................... PF8276

[51] Int. Cl.[4] ............................................... H05K 5/00

[52] U.S. Cl. .................................... 181/151; 181/149; 181/199; 181/296

[58] Field of Search ............... 181/151, 146, 152, 153, 181/199, 231, 149, 296; 381/88-90

[56] References Cited

U.S. PATENT DOCUMENTS

| | | | |
|---|---|---|---|
| 3,675,398 | 7/1972 | Giarrizzo | 181/231 X |
| 4,004,094 | 1/1977 | Ott | 181/151 X |
| 4,101,736 | 7/1978 | Czerwinski | 181/151 X |
| 4,356,882 | 11/1982 | Allen | 181/151 |
| 4,450,929 | 5/1984 | Marrs | 181/199 X |
| 4,506,759 | 3/1985 | Fatovic | 181/151 |

*Primary Examiner*—Benjamin R. Fuller

*Attorney, Agent, or Firm*—Knobbe, Martens, Olson & Bear

[57] ABSTRACT

A pressure modifying device and method which utilizes a gas or vapor and an adsorbent material to reduce the amplitude of pressure variations in gas or vapor. The technique is applicable to loudspeaker assemblies having a box (2), low frequency loudspeaker (16) and a mass (20) of activated charcoal in the box. Excursions of the cone (18) of the loudspeaker in the range 20 to 100 Hz cause pressure fluctuations in the air in the box but the size of those pressure fluctuations is comparatively small owing to increased air adsorption on the activated charcoal leading to increased efficiency.

16 Claims, 6 Drawing Figures

CONSTANT PRESSURE DEVICE

This invention relates to a constant pressure device.

More particularly, the invention is concerned with techniques for eliminating or substantially eliminating pressure variations in an essentially closed volume, which variations would tend to occur when the capacity of said volume is reduced. For instance, the interior of a loudspeaker box is an essentially closed volume which is effectively reduced in volume when the loudspeaker cones make excursions into the interior of the box. Such excursions tend therefore to increase the pressure in the box and by the techniques of the invention, such pressure variations are significantly reduced.

According to the present invention there is provided a loudspeaker assembly comprising

- a speaker box,
- at least one loudspeaker mounted so that a rear part of the speaker is in communication with the interior of the box,
- a gas or vapour located within the box, and
- a mass of material located in the box, said material being adsorbent to at least one component of the gas or vapour to a degree which is dependent upon the partial pressure thereof whereby pressure increases in the gas or vapour in the box resulting from excursions of said loudspeaker into the box are relatively low because of increased adsorption of said component on said mass of material.

The invention also provides a method of stabilizing pressure in an effectively closed volume which contains a gas or vapour and is subject to variations in volume comprising the step of introducing into the volume a mass of adsorbent material into the volume, said adsorbent material being selected whereby at least one component of the gas or vapour is adsorbed thereon to a degree which depends upon the partial pressure of said component, whereby pressure variations consequent upon said variations in volume are less than those which would occur if said material were not present in the volume.

The invention further provides a pressure stabilizing device comprising

- means defining an effectively closed space,
- a gas or vapour disposed within the volume,
- a mass of adsorbent material located in said volume and exposed to said gas or vapour said adsorbent material being such that at least a component of said gas or vapour is adsorbable thereon to a degree which is dependent on the partial pressure of said component whereby the pressure in said volume is generally independent of changes in the volume of said space.

The expression "essentially closed" is intended to cover an arrangement in which the aforementioned gas or vapour is located within gas or vapour tight surroundings so that there is no flow of gas or vapour to or from those surroundings. Alternatively, the arrangement could be such that there is flow of gas or vapour at to and from those surrounding at a relatively low rate whereby the steady state pressure of the gas or vapour is equal to ambient but when the gas or vapour is subjected to pressure variations at higher frequencies say in the range 20 to 100 Hz or above there is no flow of gas or vapour to and from the surroundings and the gas or vapour is thus effectively within a closed volume at those frequencies.

The invention will now be further described with reference to its application in the field of loudspeakers and with reference to the accompanying drawings, in which.

Figure 1:
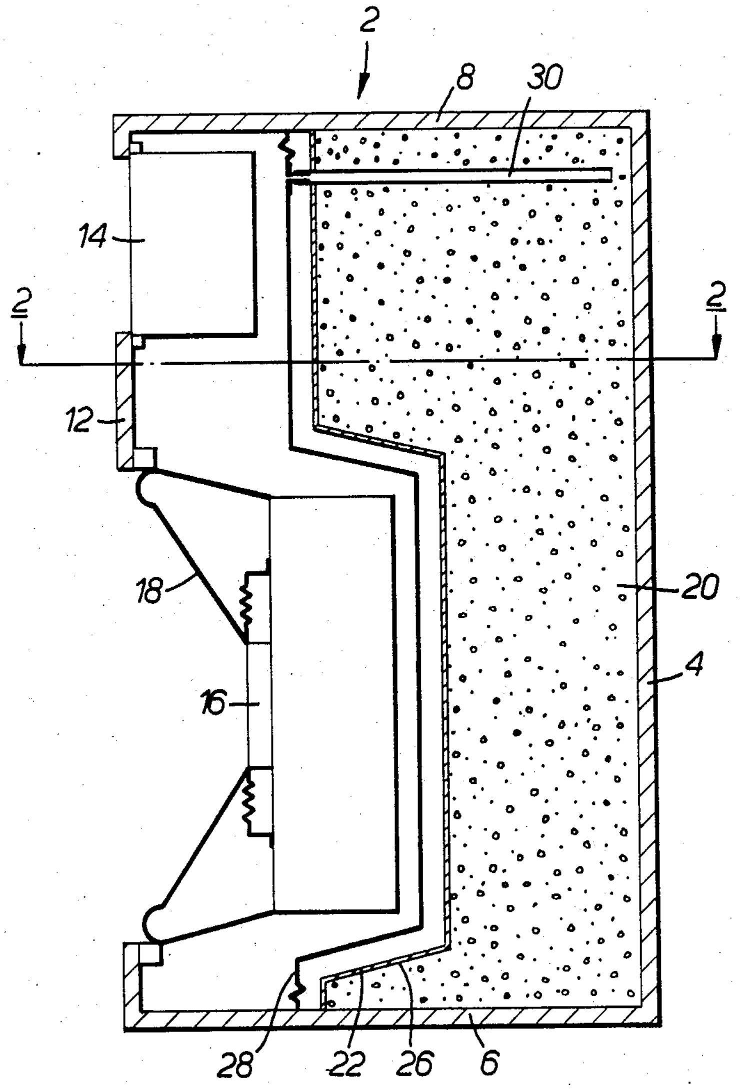
FIG. 1 is a schematic cross-sectional view through a loudspeaker assembly constructed in accordance with with the invention.

The loudspeaker assembly illustrated in FIG. 1 comprises a loudspeaker box 2 having a rear wall 4, bottom 6, top 8 and side walls 10. The front face of the box is spanned by a baffle 12 upon which a high frequency speaker 14 and low frequency speaker 16 are mounted in a generally conventional manner. In use the cone 18 of the low frequency speaker 16 makes relatively large excursions into the box and these excursions tend to increase the pressure within the box. If the box is a sealed enclosure the pressure does build up and restricts movement of the cone and therefore decreases the inward excursion of the cone and therefore the sound amplitude produced by the speaker. If the speaker box is not sealed a similar reduction in output occurs because inward and outward excursions of the cone relative to the box cause pressure variations which in turn cause air to flow to and from the interior of the box. Thus, part of the energy supplied to the speaker is lost in pumping air to and from the enclosure and this again results in restricting the amplitude of movement of the cone and hence the amplitude of the sound waves produced thereby.

In accordance with the invention a mass 20 of adsorbent material is located within the box 2 so as to at least partially nullify the effects of increased pressure in the speaker box so that the cone of the speaker is less impeded and therefore is capable of producing more sound ouput for a given power input.

Figure 2:
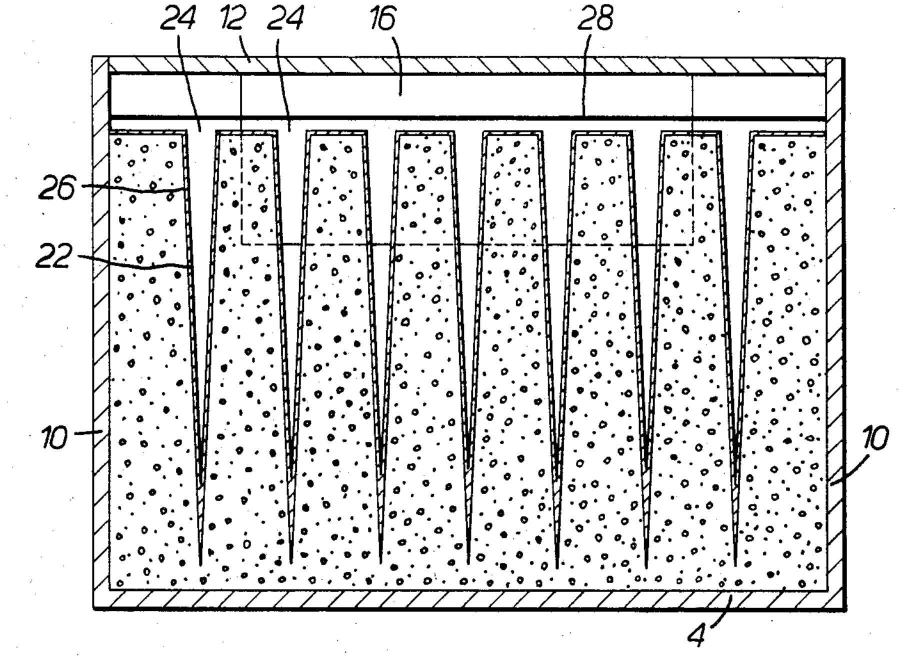
FIG. 2 is a schematic cross-sectional view taken along the line 2—2.

In the preferred embodiment of the invention the interior of the box 2 is provided with a mass 20 of activated charcoal or carbon in granular form. The granules are preferably held in place by means of a support structure 22 which has a mesh like surface and is preferably formed as an integral molding from plastics material or is formed from expanded metal sheet. The support structure 22 is preferably shaped so as to have inwardly directed channels 24 which provide relatively wide passageways for air to the granules, as seen in FIG. 2. The inner surface of the structure 22 is preferably lined with a porous fabric such as filter paper which prevents the relatively small charcoal or carbon granules from falling through the support structure 22. It is desirable that the granules are kept free from moisture and accordingly a moisture impermeable diaphragm 28 is located within the box between the granules and the speakers 14 and 16. The diaphragm 28 preferably comprises a sheet of plastics material or other resilient sheet which transmits pressure variations on one side thereof to the other side thereof. In this way pressure variations caused by excursions of the cone 18 of the speaker 16 in the air within the space defined between the baffle 12 and the diaphragm 18 are transmitted to the air to the other side of the diaphragm i.e. the air which is exposed to the activated charcoal granules.

In some circumstances it is undesirable that the granules of activated charcoal are contained within a completely sealed space since that might give rise to undesirable pressures being developed within that space as a result of changes in ambient temperature and pressure. Accordingly, the preferred embodiment of the invention includes a vent tube 30 which extends from the diaphragm 28 into the region where the granules are located. The vent tube 30 serves to equalize the steady state pressure on either side of the diaphragm 28. The tube is preferably constructed so that no significant flow of air takes place therethrough as a result of pressure variations in the frequency range of variations produced by the speaker 16 that is in the range of above say 20 Hz or in the range of 20 to 100 Hz.

Figure 3:
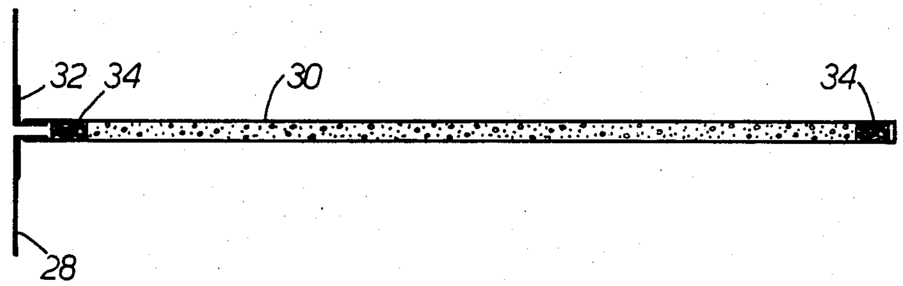
FIG. 3 is a schematic view of an air trap which forms part of the loudspeaker shown in FIG. 1.

FIG. 3 illustrates a preferred arrangement for the vent tube 30. It comprises a polythene tube of say 8 mm in diameter and approximately 60 cm long. One end of the tube is pressfit on a mounting spigot 32 which is attached to the inner face of the diaphragm 28. The tube 30 is filled with activated charcoal which is in the form of a powder say having a particle size of 0.05 mm. The activated charcoal is retained in the tube by means of plugs 34 of fibrous material. The activated charcoal within the tube is preferably wide pored low hysteresis form of activated charcoal whereby the tube functions as a moisture barrier to substantially prevent moisture from entering the region of the mass 20 of charcoal granules. Further, the fine powdered form of the charcoal within the tube effectively prevents flow of air therethrough at the operating frequencies of the speaker 16.

Figure 6:
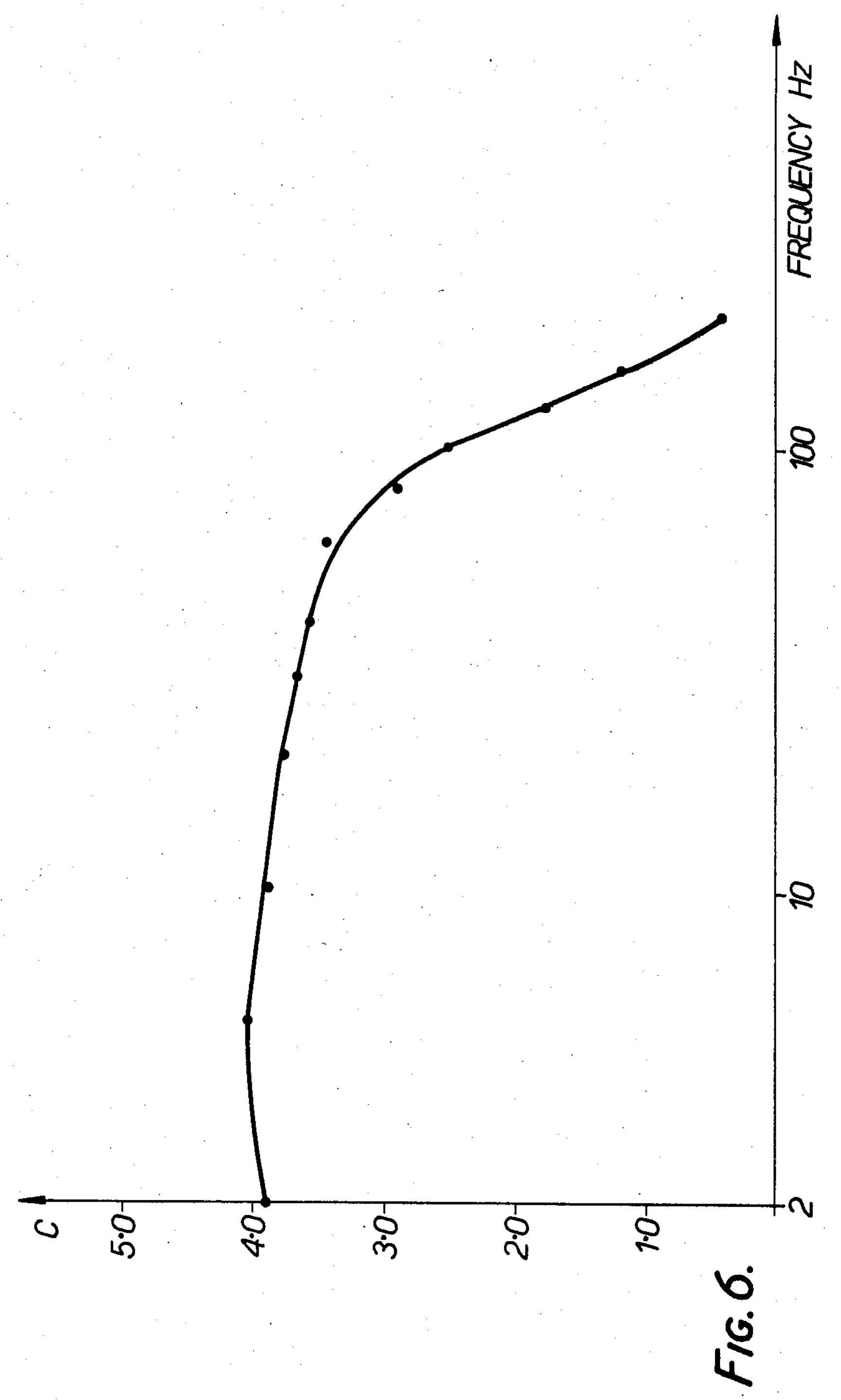
FIG. 6 is a graph of a parameter C as a function of frequency, the parameter C being related to the factor by which pressure variations are reduced within the speaker enclosure in accordance with the techniques of the invention.

When the speaker is operated, the excursions of the cone 18 of the speaker 16 cause pressure fluctuations within the air space surrounding the mass 20 of activated charcoal granules. The air surrounding the granules is adsorbed thereon to a degree which is proportional to the pressure of the air. Thus, any increment in pressure is effectively offset by increased adsorption of air onto the activated charcoal granules. This property has been tested and is graphically illustrated in FIG. 6. In that figure, the ordinate axis shows the C factor which is defined as the relative compressibility of the air within a speaker box filled with activated charcoal granules compared to the compressibility of an air filled speaker box under adiabatic conditions. It will be seen that the air with the granules is between three and four times more compressible up to about 80 Hz compared to air in a similar box without the activated charcoal granules. At frequencies above about 100 Hz the effectiveness is lost because of the time taken for the air to adsorb and be released from the surface of the granules. In this test the granules comprised CG42/100 granules supplied by Mitsui, average particle diameter 0.1 to 0.3 mm and the sample volume was 2.6 liters. The apparent relative density of the carbon was 0.5 and the weight of the granules was 1.05 kilograms. The granular material was located in stacked flattened cylinders of paper intially 2.5 cm in diameter. The effectiveness of the compressibility factor C can be regarded as equivalent to having the speakers located in an air filled box of C times the volume of the box with granules.

Figure 4:
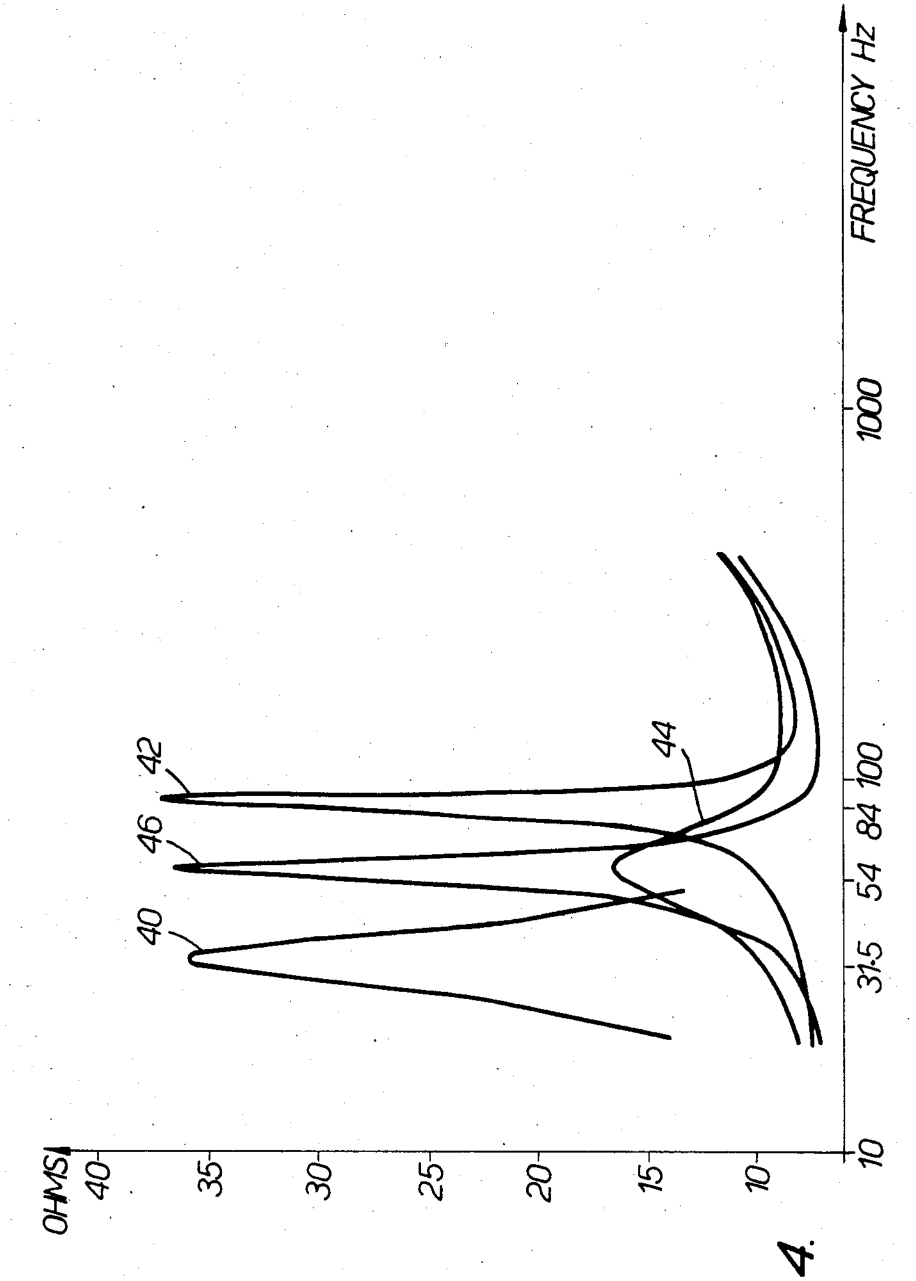
FIG. 4 is a graph showing the loudspeaker impedance as a function of frequency for various arrangements.
Figure 5:
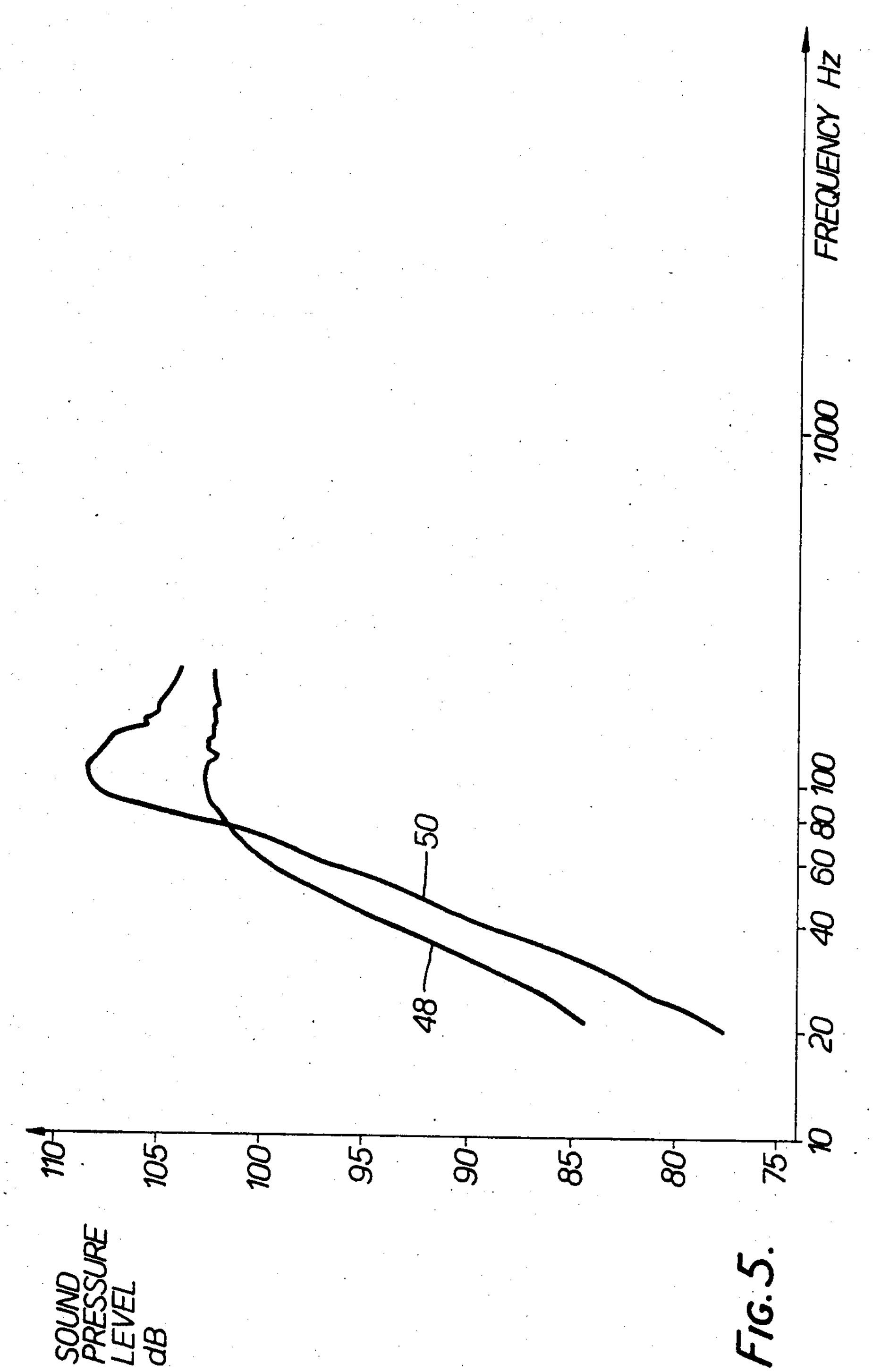
FIG. 5 is a graph showing the sound pressure level as a function of frequency for a loudspeaker of the invention compared to a known loudspeaker.

A prototype of the speaker assembly has been tested and the test results are set out in FIGS. 4 and 5. FIG. 4 shows the voice coil impedance of the speaker 16 as a function of frequency. In this test a 10 inch diameter driver speaker was used as supplied by the manufacturer Pioneer model No. C25FU90-03F. The enclosure volume was 20.5 liters and the mass 20 of carbon granules was 5.2 kilograms. The fabric material 26 was a filter paper of high porosity and of 16.5 gsm. The diaphragm 28 comprised a laminate of polypropylene, a heat sealed layer and a polyester barrier the total thickness being 0.08 mm. The speaker box was 31 cm wide, 18 cm deep and 31 cm high. The charcoal granules comprised Kuraray coal CG42/100 of relative density 0.52 and particle sizes in the range 0.1 to 0.3 mm.

The curve 40 in FIG. 4 shows the variation of voice coil impedance of the speaker mounted on a baffle but not located in the box. It will be seen that the impedance is slightly above 35 ohms at the peak at 31.5 Hz the curve 42 shows the variation of voice coil impedance with the speaker mounted in the box but there being no carbon granules therein. It will be seen that the peak impedance occurs at about 84 Hz and is about 37 ohms. The curve 44 illustrates the response of the speaker constructed in accordance with the invention and it will be observed that the peak impedance of about 16 ohms is very much less than that achieved in the two previous conditions. Further, the response is not nearly so peaked as in the other arrangements. The curve 46 was produced under similar conditions except that the speaker box was made three times larger and contained no carbon granules. It will be seen that the resonant frequency of the curve 44 which occurs at about 54 Hz is similar to that achieved (55 Hz) when the speaker is located in a box of three times the capacity but with no carbon. Thus the low frequency performance of the speaker assembly of the invention is approximately equivalent to that of a conventional box of three times its volume.

FIG. 5 illustrates the sound pressure level measured 10 cm in front of the speaker 16 as a function of frequency. The curve 48 represents the response of the prototype of the invention (which is the same as that tested for the curve 44 shown in FIG. 4) and the curve 50 shows the response of a similar speaker enclosure but containing no carbon granules (i.e. the same as that tested to produce the curve 42 in FIG. 4). It will be firstly observed that the response of the speaker enclosure of the invention is considerably greater than the response of the enclosure containing no carbon between 20 and 60 Hz. Further, at the lower end of the frequency range the performance is approximately 8 dB higher than the unfilled speaker enclosure. The curve 50 of the unfilled enclosure includes an undesirable peak at about 100 Hz which is effectively eliminated in the curve 48 of the speaker enclosure constructed in accordance with the invention.

It will be appreciated by those skilled in the art that the performance of the enclosure containing the activated carbon granules in accordance with the invention is superior to that not containing the granules.

The principles of the invention have applications in other fields of technology, for instance, in any situation where it was desired to reduce the effects of variations of pressure. One example is in the mounting of delicate equipment in a manner which is effectively isolated from vibration and shock. This is sometimes achieved by utilizing inflatable cushions which for instance might resemble an inflated tube for a car tyre. In accordance with the principles of the invention, the interior of the inflatable member can be filled or partly filled with activated carbon material whereby an effective mounting member can be provided which is of much smaller volume compared with a member which has no activated charcoal therein.

Many modifications will be apparent to those skilled in the art without departing from the spirit and scope of the invention.

I claim:

1. A loudspeaker assembly comprising:
 a speaker box,
 at least one loudspeaker mounted so that a rear part of the speaker is in communication with the interior of the box,
 a gas or vapor located within the box, said gas or vapor having one or more components each exerting a partial pressure, and
 a mass of material located in the box, said material being substantially adsorbent to at least one of said components of the gas or vapor to a degree which is dependent upon the partial pressure thereof whereby pressure increases in the gas or vapor in the box resulting from excursions of said loudspeaker into the box, are relatively low because of increased adsorption of said component on said mass of material.

2. An assembly as claimed in claim 1 wherein said loudspeaker operates in the frequency range 20 to 100 Hz.

3. An assembly as claimed in claims 1 or 2 wherein said material is in granular form and is located within a water impervious barrier.

4. A pressure stabilizing device comprising:
 means defining an effectively closed space,
 a gas or vapor disposed within the volume, said gas or vapor having one or more components each exerting a partial pressure,
 a mass of substantially adsorbent material located in said volume and exposed to said gas or vapor, said adsorbent material being such that at least one of said components of said gas or vapor is adsorbable thereon to a degree which is dependent on the partial pressure of said component whereby the pressure in said volume is generally independent of changes in the volume of said space.

5. A loudspeaker assembly comprising:
 a speaker box;
 at least one loudspeaker mounted so that a rear part of the speaker is in communication with the interior of the box;
 a gas or vapor comprising air located within the box, said gas or vapor having one or more components and exerting a partial pressure; and
 a mass of solid material comprising activated charcoal located in the box, said material being adsorbent to at least one of said components of the gas or vapor to a degree which is dependent upon the partial pressure thereof whereby pressure increases in the gas or vapor in the box resulting from excursions of said loudspeaker into the box are relatively low because of increased adsorption of said component on said mass of material.

6. A loudspeaker assembly comprising:
 a speaker box;
 at least one loud speaker mounted so that a rear part of the speaker is in communication with the interior of the box;
 a gas or vapor comprising air located within the box, said gas or vapor having one or more components each exerting a partial pressure; and
 a mass of solid material comprising activated charcoal located in the box, said material being adsorbent to at least one of said components of the gas or vapor to a degree which is dependent upon the partial pressure thereof whereby pressure increases in the gas or vapor in the box resulting from excursions of said loudspeaker into the box are relatively low because of increased adsorption of said components on said mass of material, said loudspeaker operable in the frequency range 20 to 100 hertz.

7. An assembly as claimed in claim 5 or 6 wherein said material is in granular form and is located within a water impervious barrier.

8. An assembly as claimed in claim 7 wherein said barrier includes the inner walls of the box and a resilient film which spans the interior of the box and is located between the mass of material and said loudspeaker, said resilient film being operable to transmit pressure variations from one side thereof to the other.

9. An assembly as claimed in claim 5 wherein space within which said mass of material is located is vented to atmosphere so as to equalize the steady state pressure therein to atmospheric pressure.

10. An assembly as claimed in claim 9 wherein said space is vented by means of a moisture trap which contains moisture adsorbent material to resist moisture adsorption on said mass of material.

11. An assembly as claimed in claim 10 wherein said moisture trap constitutes a barrier to flow of air therethrough at pressure variation rates in the box consequent upon excursions of said loudspeaker at frequencies in the range 20 to 100 Hz.

12. An assembly as claimed in claim 7 wherein said impervious barrier includes the interior of the box and baffle spanning the front face of the box said loudspeaker being mounted on the baffle and having a cone which is water impervious.

13. An assembly as claimed in claim 5 wherein said activated charcoal is in the form of granules, the average granule size being in the range 0.1 to 0.3 mm.

14. An assembly as claimed in claim 15 wherein said granules are held in place by a support frame which is lined by a fabric.

15. A method of stabilizing pressure in an effectively closed volume which contains a gas or vapor, said gas or vapor having one or more components each exerting a partial pressure, and is subject to variations in volume comprising the step of introducing into the volume a mass of substantially adsorbent material, said adsorbent material being selected whereby at least one of said components of the gas or vapor is adsorbed thereon to a degree which depends upon the partial pressure of said component, whereby pressure variations consequent upon said variations and volume are less than those which would occur if said material were not present in the volume.

16. A method of stabilizing pressure as claimed in claim 15, wherein said effectively closed volume is a speaker box.

* * * * *